(12) United States Patent
Pavey

(10) Patent No.: US 7,133,817 B2
(45) Date of Patent: Nov. 7, 2006

(54) STATE COVERAGE TOOL

(75) Inventor: Nicholas Pavey, Almondsbury Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 887 days.

(21) Appl. No.: 10/074,265

(22) Filed: Feb. 12, 2002

(65) Prior Publication Data

US 2003/0167160 A1    Sep. 4, 2003

(51) Int. Cl.
*G06F 17/50* (2006.01)
*G06F 9/45* (2006.01)

(52) U.S. Cl. .............................. 703/16; 703/19; 716/5
(58) Field of Classification Search ................. 703/16, 703/19; 716/5
See application file for complete search history.

(56) References Cited

U.S. PATENT DOCUMENTS 6,074,426 A * 6/2000 Baumgartner et al. ........ 703/13
6,675,138 B1 * 1/2004 Hollander et al. ............ 703/13
6,694,497 B1 * 2/2004 Pavey .......................... 716/4

OTHER PUBLICATIONS

Liu et al.; Efficient coverage analysis metric for HDL design validation; IEEE Proc. Comp. & Digital Techniques; pp. 1-6; Jan. 2001.*
Gharehbaghi et al.; Behavioral test generation for VHDL processes; IEEE Proc. 12th Int. Conf. Microelectronics; pp. 123-126; Oct. 2000.*

* cited by examiner

*Primary Examiner*—Hugh Jones
(74) *Attorney, Agent, or Firm*—Lisa K. Jorgenson; Daniel P. McLoughlin; Wolf, Greenfield & Sacks, P.C.

(57) ABSTRACT

A method of verifying a digital hardware design simulated in a hardware design language (HDL). States to be verified are defined, including signal values for each component within the hardware design. A test is applied to the hardware design, such that traces of internal signals within the hardware design are recorded. Each trace includes signal data, time data and at least the internal signals associated with the components. The traces are processed to ascertain whether the plurality of components simultaneously had the signal values associated with the state, thereby to ascertain whether the state was achieved.

11 Claims, 3 Drawing Sheets

US 7,133,817 B2

STATE COVERAGE TOOL

FIELD OF INVENTION

The present invention relates to testing the state coverage of Hardware Design Language (HDL) simulations of integrated circuit designs.

BACKGROUND TO INVENTION

When verifying a digital hardware design specified using an HDL, the verification engineer is often interested to know whether the design has passed through a certain configuration of internal component signals, known as a "state".

Modern HDLs can be executed on simulation systems to produce traces of how the signals change over time. In the case of processor cores, for example, the simulation can effectively run the machine code accepted by the design. When verifying a module within the design, a test harness known as a testbench can be used to supply the correct stimuli to the design.

The signal traces can often be very long, and in a format that makes ascertaining what has actually happened relatively difficult for an engineer to ascertain, especially, where the state of interest constitutes the behaviour of multiple components over time.

SUMMARY OF INVENTION

According to the invention, there is provided a method of verifying a digital hardware design simulated in a hardware design language (HDL), the method including the steps of:
  defining at least one state to be verified, the state including a signal value for each of a plurality of components within the hardware design;
  applying a test to the hardware design;
  generating traces of internal signals within the hardware design during the test, each trace including signal data and time data and including at least the internal signals associated with the components;
  processing the traces to ascertain whether the plurality of components simultaneously had the signal values associated with the state, thereby to ascertain whether the state was achieved.

Preferably, more than one state is defined, each state having a signal value for each of a plurality components of the hardware design. The traces are processed to ascertain, for each state, whether the corresponding plurality of components simultaneously had the signal values associated with the state, thereby to ascertain whether each of the states was achieved. More preferably, the processing step includes ascertaining whether a predetermined sequence of states was achieved.

Preferably also, the processing step includes ascertaining whether a given state in a sequence was achieved within a predetermined time period after an earlier state in the sequence.

In a preferred form, the traces are pre-processed prior to the processing step, such that, for at least each of the components defined within each of the states, a value for the respective signals associated with those components exists for each time for which the traces are to be processed.

It is preferred that one or more of the signal values are values of a field associated with the corresponding component.

DETAILED DESCRIPTION OF PREFERRED AND OTHER EMBODIMENTS

Figure 1:
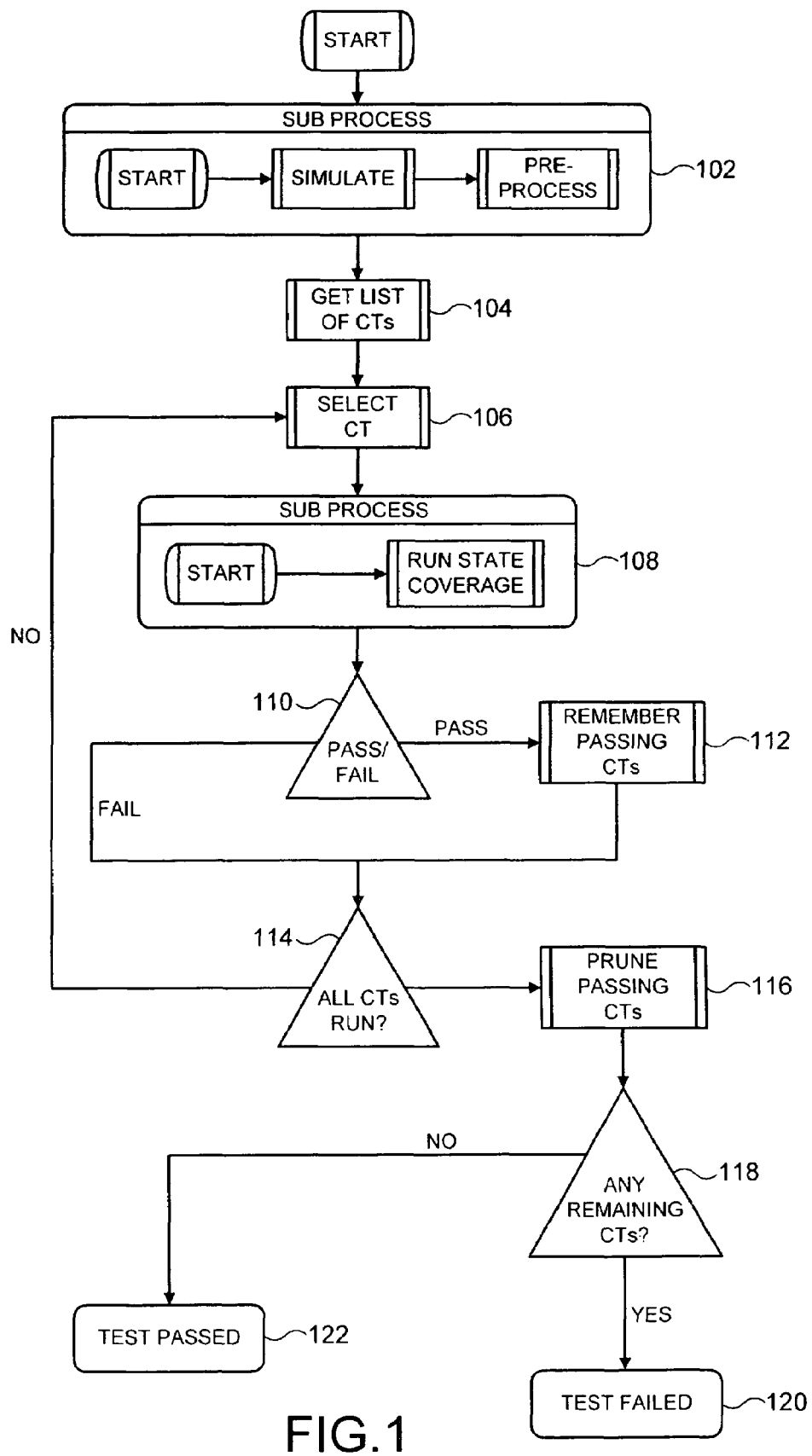
FIG. 1 is a flowchart showing coverage for a test applied to an HDL model of digital hardware, incorporating state coverage according to the invention.

Referring to FIG. 1, an HDL model is generated in a manner known to those skilled in the art. The HDL model includes a description of each of the various components in the model, such as registers, logical gates or more complex componentry. The model is used to predict the behaviour of a model before it is committed to silicon.

In the flowchart shown in FIG. 1, a first sub-process 102 is performed, in which a predetermined test is applied to the HDL model. As the test runs, signals associated with each of the components are recorded, with reference to a system clock that maintains system timing. Typically, this will involve monitoring of each component and recording changes that occur to signals associated with one or more of that component's aspects. For example, in the case of writing to a register, data will be generated stating that the value of the register has changed, recording the new value and the time at which the change occurred.

The result after the test has finished running is a dump file, which describes how every signal within the design changed over time. The dump file is in a Value Change Dump format, which includes ASCII representations of signals, values and times.

At this stage, it is desirable to run a pre-processing routine that removes data related to components that arte not of interest. The pre-processing routine also groups signals together by name, and represents signals more than one bit wide as corresponding vectors of the correct size. This improves readability whilst limiting the size of the amount of data that needs to dealt with in subsequent steps.

It is also desirable to pre-process the data in such a way that the change-based data is duplicated for each clock value. So, if a value of a register changes at clock cycle 10, and then again at clock cycle 50, and there are 100 clock cycles in the test, the data is translated from two entries showing the new value and the time it changed into an entry for each of the 100 clock cycles along with the value of the register during that cycle. This leads in many cases to a drastic increase in the amount of data stored, but it correspondingly simplifies the subsequent matching of states.

A list of coverage tests (CTs) is then selected in step 104. It will be appreciated that each CT can be as simple as a single state that is to be tested for, and only a single test might be selected. In other cases, multiple tests with one or more sequences of states to be tested for might be selected.

One of the CTs is then selected in step 106 to be tested for. Sub-process 108 is then run, which is described in more detail in relation to FIGS. 2 and 3. An assessment 110 is made as to whether the CT passed, and in the event it did, this result is stored 112 in a log for later review. A further assessment 114 is then made as to whether any further CTs remain to be tested for. If so, the procedure returns to step 106 and continues. If not, then CTs that passed are removed 116 from the CT list, and an assessment 118 made as to whether any CTs remain. If so, then the test as a whole is failed 120, and if not, then it passes 122.

Figure 2:
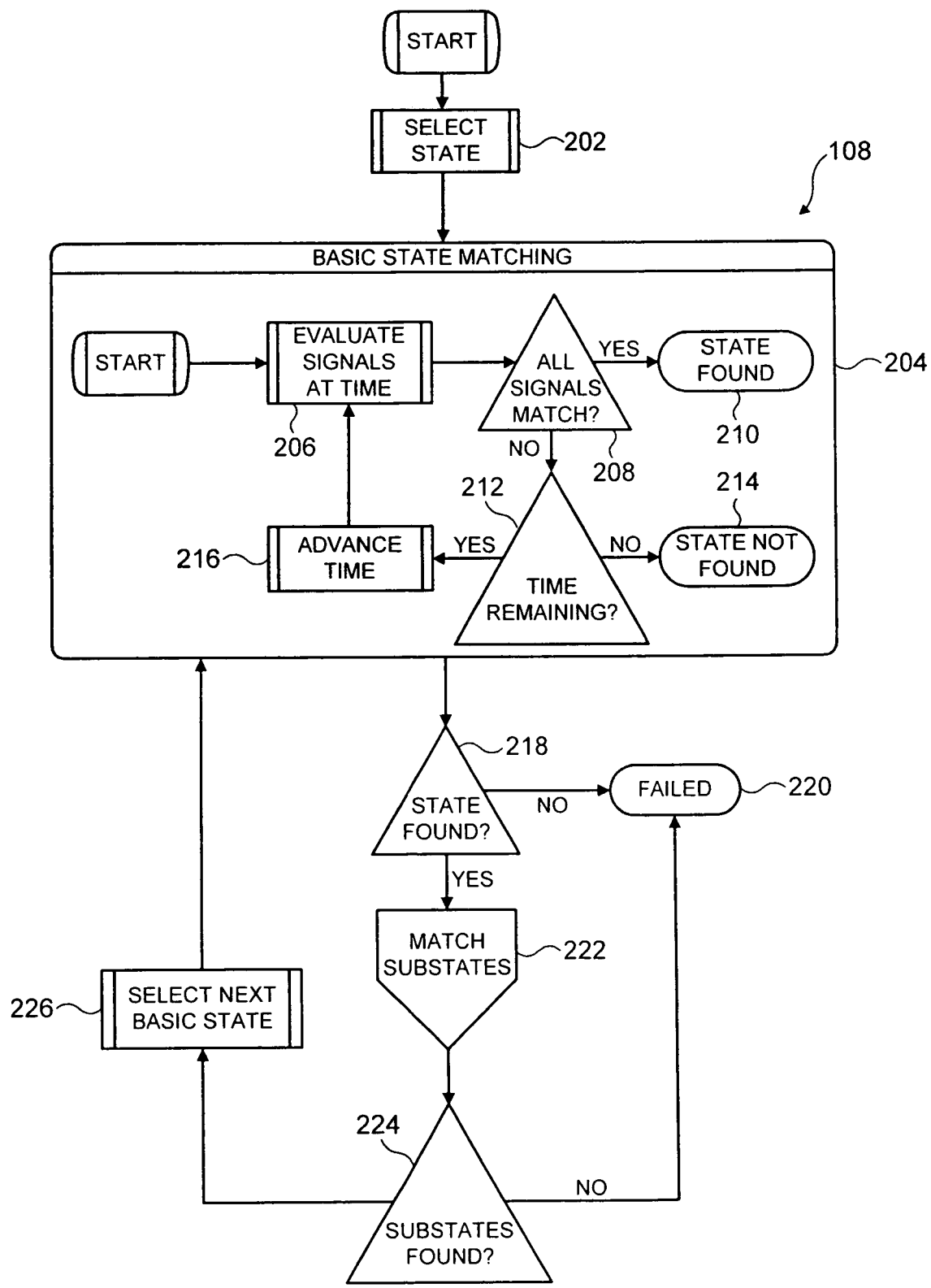
FIG. 2 is a flowchart showing the steps involved in state matching according to the invention.

Turning to FIG. 2, sub-process 108 is shown in more detail. Here it is assumed that there are multiple states to be tested for in each CT. To begin with, a state is selected 202 for testing against the pre-processed data, which includes an entry for every clock cycle for each component of interest, the entry including the value of signal of the component at that time. State matching then takes place in step 204.

Step 204 is a looped set of sub-steps. The first step is to evaluate 206 all of the signals of the components of interest at a particular time. In the event that all of the signals match 208 those defined in relation to the state being considered, then the state is found 210. If the state is not found at that time, then an assessment 212 is made as to whether there is still time for that state to occur. If such time is not available, the state is deemed not found 214. If such time is available, then the time is advanced 216 (typically by a single clock period) and the signals at the new time again evaluated 208 to ascertain whether the state has occurred. This loop continues until no further time is available or it is determined that the state has been reach.

On the issue of available time, it will be appreciated that the HDL model of digital hardware does not behave in an identical way to the actual hardware itself. In some cases, it is the movement of data and control signals via a control port that must be waited for. Also, latency can be defined by the programmed to allow time for data to ripple through multiple components. It is intrinsically difficult to accurately model such cascading effects, and so it may be necessary to introduce windows of allowable latency to prevent tests that perform correctly being rejected because states do not happen at precisely the anticipate time Once the state-matching step 204 is finished, an assessment 218 is made as to whether the state was found. If not, then the CT failed 220 and the procedure continues as per FIG. 1. If the state was found, then sub-state matching takes place 222, as described in more detail in relation to FIG. 3.

If sub-states are not found 224, then the CT failed 220 and the procedure continues as per FIG. 1. If the required sub-states are found, however, the next basic state can be selected 226 and the procedure returns to the state matching routine 204. This continues until all states and sub-states have been considered, and then the procedure continues as per FIG. 1.

Sub-state matching is used to reduce the likelihood of rejection of an acceptable test due to latency issues. The difference between a state and a sub-state is that a state is the set of signals that should be observed as all having the predetermined values at one given time. These signals will typically be those that are updated by the device itself, rather than as a response to a deliberate write to the relevant components due to implementation of the test code. Sub-states are generated in response to statements in the test that alter some internal state of a component, which introduces latency. Part of the declaration of a sub-state (discussed in more detail below) is a DELTA line that specifies the maximum allowable latency before the sub-state fails, causing the test to fail. Generally, sub-states are required when dealing with writes to control registers and similar operations.

The preferred embodiment requires that a state must first be ascertained as existing, in that the required signal not affected by the test code should all have the correct values at one particular time, t. Having matched the basic state, the procedure then start searching for sub-states, from time t. Each sub-state is searched for from this time. If all the sub-states are found within the given delta, then the whole state has passed. If they are not all found, the then test fails.

An example of where latency could be problematic will now be described. The example assumes that the coverage task is generated from an abstract test, and that the concrete test is running in an environment where there is only one target port into the peripheral. This means that only one address or peripheral register can be accessed at a time.

The peripheral module has a set of control registers COUNT and ENABLE. COUNT is initially programmed by the test and automatically updated once the test has started. ENABLE is non-volatile, and retains its value until is updated by the test.

A test might specify the initialization of all the control registers in the device into one state at the beginning of the test. The corresponding concrete test will need to sequentially set the control registers over several clock cycles, since the peripheral has only one target port. Provided the registers or peripheral state are not volatile, the state will be complete when the last transfer is made.

On subsequent states it is not desirable to try reinitialising the control registers that are automatically modified, because this would mean that all that is being tested is the ability of the control register to accept reads and writes, and latency would probably affect the outcome of the test. However, it is likely that the subsequent states are going to try to program other control registers in the device as well as observing the value of the auto-modified register.

There will always be a latency associated with writing to a control register, which means that the state actually spreads over multiple clock cycles. For example, assume that the COUNT register contains the value 10 when the test attempts to zero the enable register to suspend the device. Due to latency, it is possible that the COUNT register will be decremented to 9 before the disable actually takes place.

If the state were to be interpreted as being a time at which COUNT is equal to 10 and the device disabled, the test would be counted a failure.

Figure 3:
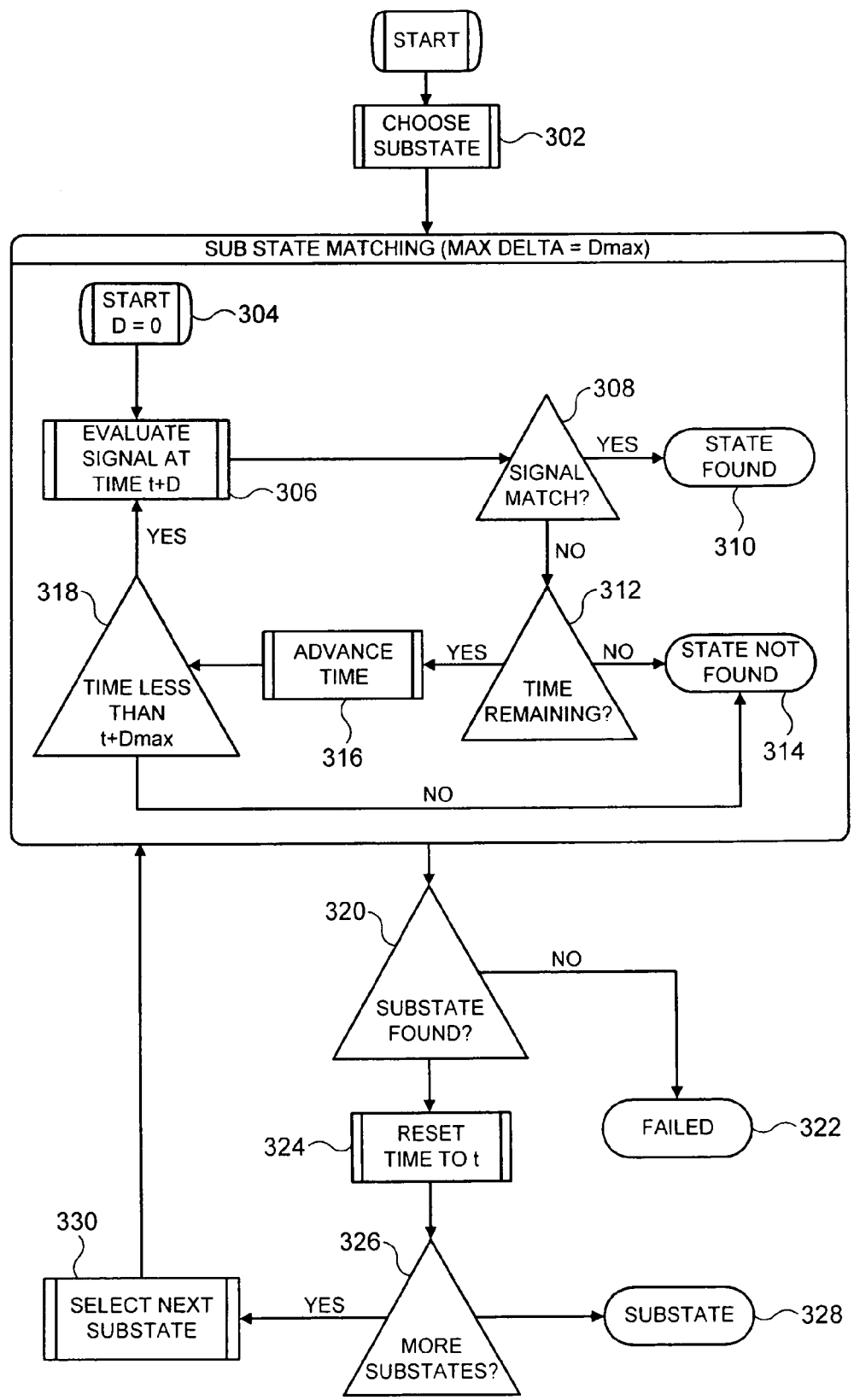
FIG. 3 is a flowchart showing the steps involved in sub-state matching.

Turning to FIG. 3, the steps for sub-state matching 222 are shown. First a sub-state is chosen 302 from a list of sub-states to be searched for. A counter, d, is initialised 304 to zero, and the signals(s) of interest are evaluated 306 at time t+d. If the signals match 308 the state that is being searched for, then the sub-state is found 310. If the sub-state is not found, it is determined 312 whether there is any time remaining. If no time remains, then the sub-state is not found 314. If there is time remaining, d is incremented 316. If the subsequent value of d exceeds a predetermined maximum, then the state is deemed not found 314. When the maximum for d is not reached at this stage, then the subroutine goes back to evaluating 306 signals at the new time.

Once the sub-state has been found or the time has run out, an assessment 320 is made, and if the sub-state was not found, the routine is deemed to fail 322. If the sub-state was found, the time is reset 324 to t, and it is determined 326 whether there are any more sub-states to search for. If not, then the sub-state search routine is completed 328. However, if there are more sub-states to be searched for, then the next one is selected 330 and the routine returns to step 304. The loop is repeated until all sub-states have been searched for, and then continues with the procedure outlined in relation to FIG. 1.

Signals can be defined in each state in terms of the signal per se, or with reference to a field or mask. The following is an example signal definition in an HDL
SIGNAL: testbench.bclk
SIGNAL

```
:testbench.dmac_dmacontroller_qbinst.u_dmaccr.cr_com_
    sw_view
    SIGNAL
:testbench.dmac_dmacontroller_qbinst.u_dmaccr.cr_
    ch0ctl_s w_view
    FIELD: master_enable,
testbench.dmac_dmacontroller_qbinst.u_dmaccr.cr_com_
    sw_view, .*([01xz]) [01xz] {3}
    FIELD: priority,
testbench.dmac_dmacontroller_qbinst.u_dmaccr.cr_com_
    sw_view, .*([01xz])
    FIELD: transfer_enable0,
testbench.dmac_dmacontroller_qbinst.u_dmaccr.cr_
    ch0ctl_sw _view, .*([01xz]) [01xz] {12}
    FIELD: resource_select0,
testbench.dmac_dmacontroller_qbinst.u_dmaccr.cr_
    ch0ctl_sw _view, .*([01xz] {4}) [01xz] {7}
```

It will be seen that several fields can be extracted from one signal, and any state that is being searched for can be defined in terms of signals and/or their parts (e.g., fields). This can also be achieved by masking, where the entire signal data is looked at, but a mask applied to ensure that only bits that are of interest are compared with the desired state.

The method of the invention drastically simplifies the task of hardware design engineers by allowing easy and relative efficient assessment of state coverage.

Although the invention has been designed with reference to specific examples, it will be appreciated that the invention can be embodied in many other forms.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of verifying a digital hardware design simulated in a hardware design language (HDL), including the steps of:
    defining at least one state to be verified, the at least one state including a set of signal values, each signal value corresponding to a respective one of a plurality of components within the hardware design;
    applying a test to the hardware design;
    generating traces of internal signals within the hardware design during the test, each trace including signal data, time data and internal signal values associated with the plurality of components; and
    processing the traces to ascertain whether the plurality of components simultaneously had the signal values defined for the at least one state, thereby to ascertain whether the at least one state was achieved.

2. A method according to claim 1, wherein more than one state is defined, each state including a set of signal values, each signal value corresponding to a respective one of a plurality components of the hardware design, the traces being processed to ascertain, for each state, whether the corresponding plurality of components simultaneously had the signal values defined for the state, thereby to ascertain whether each of the states was achieved.

3. A method according to claim 2, wherein the processing step includes ascertaining whether a predetermined sequence of states was achieved.

4. A method according to claim 3, wherein the processing step includes ascertaining whether a given state in a sequence was achieved within a predetermined time period after an earlier state in the sequence.

5. A method according to claim 1, wherein the traces are pre-processed prior to the processing step, such that, for at least each of the components for which a signal value is defined within the at least one state, the trace associated with the component includes a signal value for each time for which the traces are to be processed.

6. A method according to claim 1, wherein one or more of the signal values are values of a field associated with the corresponding component.

7. A method of verifying a digital hardware design simulated in a hardware design language (HDL), including the steps of:
    defining at least one state to be verified, the at least one state including a set of signal values, each signal value corresponding to a respective one of a plurality of components within the hardware design;
    applying a test to the hardware design;
    generating traces of internal signals within the hardware design during the test, each trace including signal data, time data and internal signal values associated with a respective one of the plurality of components;
    pre-processing the traces such that, for at least each of the components for which a signal value is defined within the at least one state, a trace associated with the component includes a signal value for each time for which the traces are to be processed; and
    processing the traces to ascertain whether the plurality of components simultaneously had the signal values defined for the at least one state, thereby to ascertain whether the at least one state was achieved.

8. A method according to claim 7, wherein more than one state is defined, each state including a set of signal values, each signal value corresponding to a respective one of a plurality components of the hardware design, the traces being processed to ascertain, for each state, whether the corresponding plurality of components simultaneously had the signal values defined for the state, thereby to ascertain whether each of the states was achieved.

9. A method according to claim 8, wherein the processing step includes ascertaining whether a predetermined sequence of states was achieved.

10. A method according to claim 9, wherein the processing step includes ascertaining whether a given state in a sequence was achieved within a predetermined time period after an earlier state in the sequence.

11. A method according to claim 7, wherein one or more of the signal values are values of a field associated with the corresponding component.

* * * * *